United States Patent
Maehata (10) Patent No.: US 12,476,652 B2
(45) Date of Patent: Nov. 18, 2025

(54) 1-BIT DIGITAL-TO-ANALOG CONVERTER, SIGNAL PROCESSING DEVICE, TRANSMITTER, AND CONVERSION METHOD

(71) Applicant: Sumitomo Electric Industries, Ltd., Osaka (JP)

(72) Inventor: Takashi Maehata, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 137 days.

(21) Appl. No.: 18/413,992

(22) Filed: Jan. 16, 2024

(65) Prior Publication Data
US 2024/0333303 A1    Oct. 3, 2024

(30) Foreign Application Priority Data
Apr. 3, 2023    (JP) ................ 2023-060131

(51) Int. Cl.
*H03M 3/00*    (2006.01)

(52) U.S. Cl.
CPC ............ *H03M 3/50* (2013.01); *H03M 3/43* (2013.01)

(58) Field of Classification Search
CPC ............ H03M 3/00; H03M 3/50; H03M 3/43
See application file for complete search history.

(56) References Cited

U.S. PATENT DOCUMENTS

| | | | | |
|---|---|---|---|---|
| 6,265,948 B1* | 7/2001 | Stevenson | ............... | H04L 27/12 375/272 |
| 6,288,618 B1* | 9/2001 | Stevenson | ............... | H04L 27/12 375/334 |
| 6,326,912 B1* | 12/2001 | Fujimori | ............... | H03M 3/412 341/172 |
| 6,340,940 B1* | 1/2002 | Melanson | ............. | H03M 3/392 341/143 |
| 6,456,219 B1* | 9/2002 | Schreiber | ............... | H03M 3/458 341/143 |
| 6,674,812 B1* | 1/2004 | Stevenson | ........... | H04L 27/2334 375/302 |
| 7,183,954 B1* | 2/2007 | Melanson | ........... | H03M 7/3015 341/143 |
| 9,294,120 B2* | 3/2016 | Zhang | .................... | H03M 3/464 |
| 2003/0058146 A1* | 3/2003 | Sundquist | ............. | H03M 3/432 341/143 |
| 2005/0099327 A1* | 5/2005 | Robinson | .................. | H03F 3/24 341/143 |
| 2009/0140898 A1* | 6/2009 | Ceballos | ............... | H03M 3/372 341/143 |
| 2016/0056838 A1* | 2/2016 | Zhang | .................. | H03M 3/422 341/143 |
| 2021/0399737 A1* | 12/2021 | Furenlid | ............... | H03M 3/324 |
| 2022/0247426 A1* | 8/2022 | Ritter | .................... | H03M 3/422 |
| 2024/0333303 A1* | 10/2024 | Maehata | ................. | H03M 3/50 |

FOREIGN PATENT DOCUMENTS

JP    2014-014059 A    1/2014

\* cited by examiner

*Primary Examiner* — Lam T Mai
(74) *Attorney, Agent, or Firm* — Volpe Koenig (57) ABSTRACT

A 1-bit digital-to-analog converter includes a clock and data recovery circuit configured to output a recovered clock signal and a recovery signal, based on a 1-bit digital input signal; and a switch to which an analog pulse train based on the recovered clock signal is given. The switch is on/off controlled by the recovery signal, and outputs an analog pulse signal in which the analog pulse train is made intermittent according to the recovery signal.

10 Claims, 8 Drawing Sheets

(a) Eye pattern

1-BIT DIGITAL-TO-ANALOG CONVERTER, SIGNAL PROCESSING DEVICE, TRANSMITTER, AND CONVERSION METHOD

TECHNICAL FIELD

The present disclosure relates to a 1-bit digital-to-analog converter, a signal processing device, a transmitter, and a conversion method.

This application claims priority on Japanese Patent Application No. 2023-060131 filed on Apr. 3, 2023, the entire content of which is incorporated herein by reference.

BACKGROUND ART

PATENT LITERATURE 1 discloses a transmitter that transmits an RF signal. This transmitter is provided with a delta-sigma modulator.

A quantized signal generated by the delta-sigma modulator includes an RF signal as an analog signal component at a predetermined frequency (target frequency).

PATENT LITERATURE 1 discloses that if the waveform of a pulse signal after delta-sigma modulation is distorted such that a rising waveform part and a falling waveform part are asymmetric, quality of an RF signal included in the pulse signal as a signal component is degraded.

CITATION LIST

Patent Literature

PATENT LITERATURE 1: Japanese Laid-Open Patent Publication No. 2014-14059

SUMMARY OF THE INVENTION

A 1-bit digital-to-analog converter according to an embodiment includes: a clock and data recovery circuit configured to output a recovered clock signal and a recovery signal, based on a 1-bit digital input signal; and a switch to which an analog pulse train based on the recovered clock signal is given. The switch is on/off controlled by the recovery signal, and outputs an analog pulse signal in which the analog pulse train is made intermittent according to the recovery signal.

DETAILED DESCRIPTION

Problems to be Solved by the Present Disclosure

Generally, a 1-bit digital-to-analog converter is disposed so as to follow a delta-sigma modulator. The 1-bit digital-to-analog converter converts a quantized signal, which is a digital signal generated by the delta-sigma modulator, into a pulse signal having two voltage levels (two states), and outputs the pulse signal.

Therefore, there is a possibility that the 1-bit digital-to-analog converter promotes the distortion that occurs in the signal waveform after the delta-sigma modulation (asymmetry between the rising waveform part and the falling waveform part), and moreover, there is a possibility that the 1-bit digital-to-analog converter itself causes the distortion.

Therefore, a 1-bit digital-to-analog converter capable of generating a signal that is not affected by distortion of a waveform part in a transition period such as a rising waveform part or a falling waveform part, is desired.

It is conceivable that, also when the 1-bit digital-to-analog converter converts a digital signal other than the quantized signal from the delta-sigma modulator, distortion, which occurs during a transition period of a signal waveform outputted from the 1-bit digital-to-analog converter, may affect characteristics of the digital signal. Therefore, the above problem is also a problem possessed by a 1-bit digital-to-analog converter that converts a digital signal other than the quantized signal from the delta-sigma modulator.

Effects of the Present Disclosure

According to the present disclosure, it is possible to generate a signal that is not affected by distortion of a waveform part in a transition period.

Description of Embodiment of the Present Disclosure

First, contents of embodiments of the present disclosure are listed and described.

(1) A 1-bit digital-to-analog converter according to an embodiment includes: a clock and data recovery circuit configured to output a recovered clock signal and a recovery signal, based on a 1-bit digital input signal; and a switch to which an analog pulse train based on the recovered clock signal is given. The switch is on/off controlled by the recovery signal, and outputs an analog pulse signal in which the analog pulse train is made intermittent according to the recovery signal.

According to the above configuration, the analog pulse signal is generated by making the analog pulse train intermittent based on the recovered clock signal.

Therefore, the analog pulse signal is generated regardless of the transition periods of the digital input signal and the recovery signal (periods corresponding to a rising waveform part and a falling waveform part).

Therefore, even if distortion is present in the waveform parts in the transition periods of the digital input signal and the recovery signal, the analog pulse signal does not take over the distortion of the digital input signal and the recovery signal.

As a result, it is possible to generate the analog pulse signal as a signal that is not affected by the distortion of the waveform part in the transition period.

(2) In the 1-bit digital-to-analog converter according to the above (1), the analog pulse train may include a plurality of pulses obtained from the recovered clock signal and a plurality of non-signal periods having a predetermined time interval such that the pulses and the non-signal periods are alternately aligned along a time axis.

In this case, the switch can be controlled such that the analog pulse train is interrupted in the non-signal periods. This inhibits transient components from occurring due to on/off of the switch, and inhibits distortion from occurring due to on/off of the switch.

(3) The 1-bit digital-to-analog converter according to the above (1) or (2) may further include a pulse generator configured to generate the analog pulse train, based on the recovered clock signal.

(4) In the 1-bit digital-to-analog converter according to the above (3), the pulse generator may include an amplifier circuit having an operating point that is set to amplify only a part of the recovered clock signal.

In this case, during a period for amplifying a part of the recovered clock signal, the pulse generator outputs a part of the recovered clock signal. Meanwhile, a period other than the period for amplifying a part of the recovered clock signal is a non-signal period. Therefore, use of the amplifier circuit allows the pulse generator to obtain an analog pulse signal including a plurality of pulses and a plurality of non-signal periods that are alternately aligned.

(5) The 1-bit digital-to-analog converter according to the above (2) may further include a phase shifter configured to adjust a phase of the recovered clock signal or a phase of the analog pulse train such that the pulses are arranged in constant level periods in the recovery signal.

In this case, the pulses can be arranged between the transition periods aligned along the time axis in the recovery signal.

(6) The 1-bit digital-to-analog converter according to any one of the above (1) to (5) may further include a bandpass filter configured to remove a harmonic component included in the recovered clock signal, from the recovered clock signal.

In this case, the recovered clock signal from which the harmonic component has been removed is obtained. That is, the recovered clock signal mainly including a fundamental component is obtained. Thus, the distortion component included in the recovered clock signal can be reduced.

(7) In the 1-bit digital-to-analog converter according to any one of the above (1) to (6), the 1-bit digital input signal may be a quantized signal modulated by a delta-sigma modulator.

In this case, the quantized signal modulated by the delta-sigma modulator can be converted into an analog signal that is not affected by distortion that occurs in the waveform part in the transition period.

(8) A signal processing device according to another aspect of the embodiment includes: a delta-sigma modulator; and the 1-bit digital-to-analog converter according to the above (1) to which a quantized signal outputted from the delta-sigma modulator is given as a 1-bit digital input signal.

(9) A transmitter according to another aspect of the embodiment includes: a delta-sigma modulator configured to perform delta-sigma modulation on an RF signal; the 1-bit digital-to-analog converter according to the above (1) to which a quantized signal outputted from the delta-sigma modulator is given as a 1-bit digital input signal; and a transmission unit configured to wirelessly transmit the analog pulse signal.

(10) A conversion method according to another aspect of the embodiment is a method for converting a 1-bit digital input signal. This conversion method includes: generating a recovered clock signal and a recovery signal, based on the digital input signal; generating an analog pulse train, based on the recovered clock signal; and generating an analog pulse signal in which the analog pulse train is made intermittent according to the recovery signal.

Details of Embodiment of the Present Disclosure

Hereinafter, preferred embodiments will be described with reference to the drawings.

At least some parts of the embodiments described below may be combined together as desired.

[Configuration of Transmitter]

Figure 1:
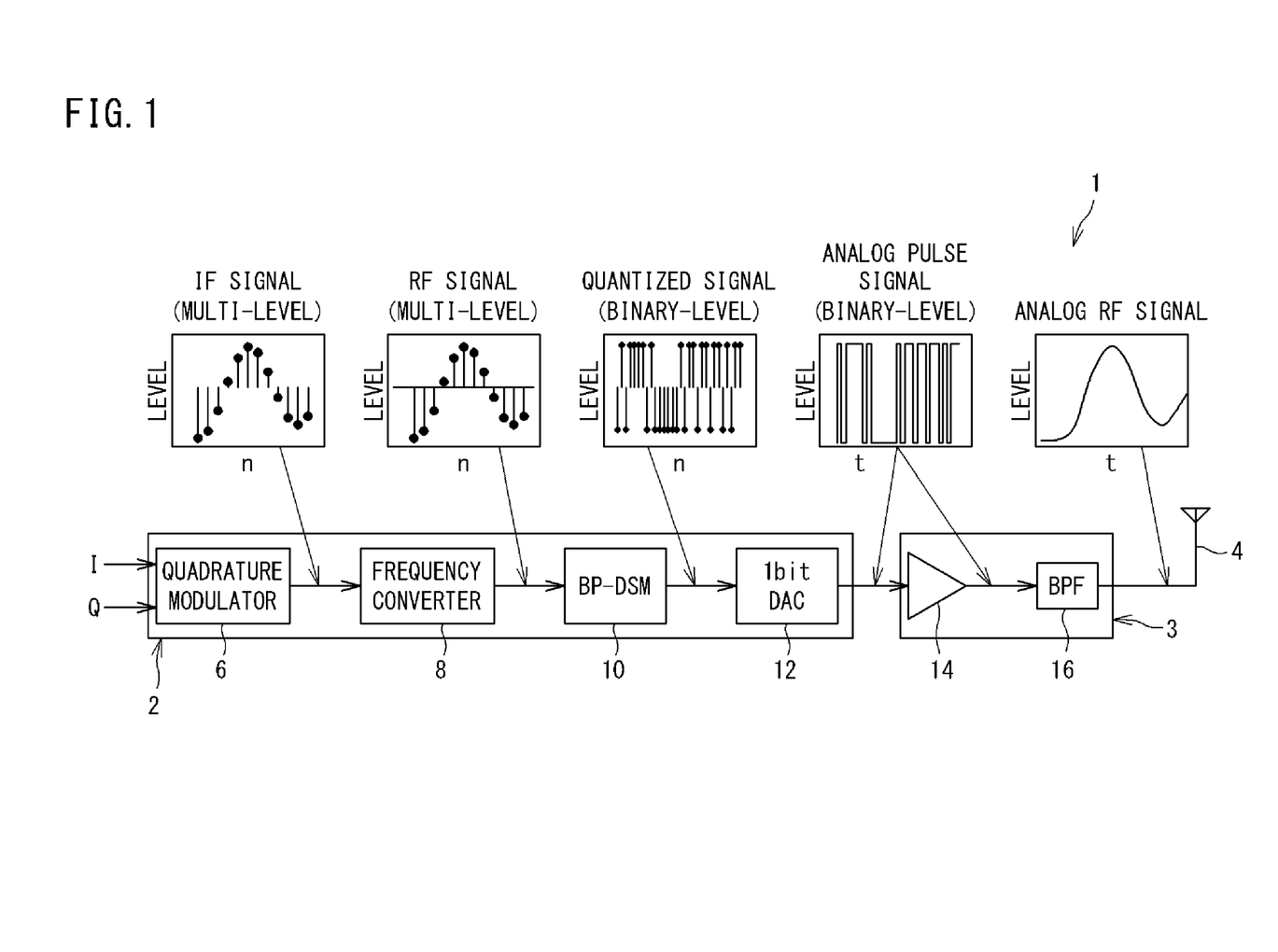
FIG. 1 is a block diagram showing an example of a transmitter.

FIG. 1 is a block diagram showing an example of a transmitter. This transmitter 1 is a transmitter used in, for example, a base station or a mobile terminal in a 5th-generation mobile communication system.

In FIG. 1, the transmitter 1 includes a digital signal processing unit 2, a transmission unit 3, and an antenna 4.

Baseband signals I, Q that are digital transmission signals are given to the digital signal processing unit 2. The digital signal processing unit 2 performs signal processing on the baseband signals I, Q, and gives, to the transmission unit 3, an analog pulse signal that is a binary-level pulse signal obtained through the signal processing.

The transmission unit 3 amplifies the analog pulse signal given from the digital signal processing unit 2, and gives a radio frequency (RF) signal included in the analog pulse signal to the antenna 4.

The antenna 4 radiates the RF signal given from the transmission unit 3 into the space as a radio wave.

The RF signal transmitted by the transmitter 1 includes, for example, a signal in a frequency band used in a 4th-generation mobile communication system, and a signal in a frequency band used in a 5th-generation mobile communication system.

The digital signal processing unit 2 includes a quadrature modulator 6, a frequency converter 8, a delta-sigma modulator 10, and a 1-bit digital-to-analog converter 12.

The quadrature modulator 6 has a function of performing quadrature modulation as primary modulation on the baseband signals I, Q, through digital signal processing.

The quadrature modulator 6 performs quadrature modulation on the baseband signals I, Q, and outputs an intermediate frequency (IF) signal that is a digital signal.

The IF signal is a multi-level (multivalued) discrete time signal as shown in FIG. 1. Each of discrete values included in the IF signal represents an intermediate-frequency modulated signal. That is, the IF signal is an intermediate-frequency modulated signal represented by the discrete time signal. The IF signal is given to the frequency converter 8.

The frequency converter 8 has a function of performing frequency conversion on the IF signal, through digital signal processing. In addition, the frequency converter 8 has a function of up-sampling the IF signal, through digital signal processing.

The frequency converter 8 frequency-converts (up-converts) the IF signal from the intermediate frequency to the radio frequency.

Up-sampling by the frequency converter 8 is performed at a sampling frequency according to the radio frequency.

The frequency converter 8 performs up-conversion and up-sampling on the IF signal, and outputs an RF signal that is a digital signal.

The RF signal outputted from the frequency converter 8 is a multi-level (multivalued) discrete time signal as shown in FIG. 1. Each of discrete values included in the RF signal represents a radio-frequency modulated signal. That is, the RF signal is a radio-frequency modulated signal represented by the discrete time signal. The RF signal is given to the delta-sigma modulator 10.

The delta-sigma modulator (BP-DSM) 10 has a function of performing delta-sigma modulation as secondary conversion on the RF signal, through digital signal processing. The delta-sigma modulator 10 of this embodiment is a bandpass type delta-sigma modulator.

The delta-sigma modulator 10 performs delta-sigma modulation on the RF signal, and outputs a quantized signal that is a digital signal.

The quantized signal is a binary-level discrete time signal as shown in FIG. 1. The quantized signal contains the RF signal as a frequency component.

Figure 2:
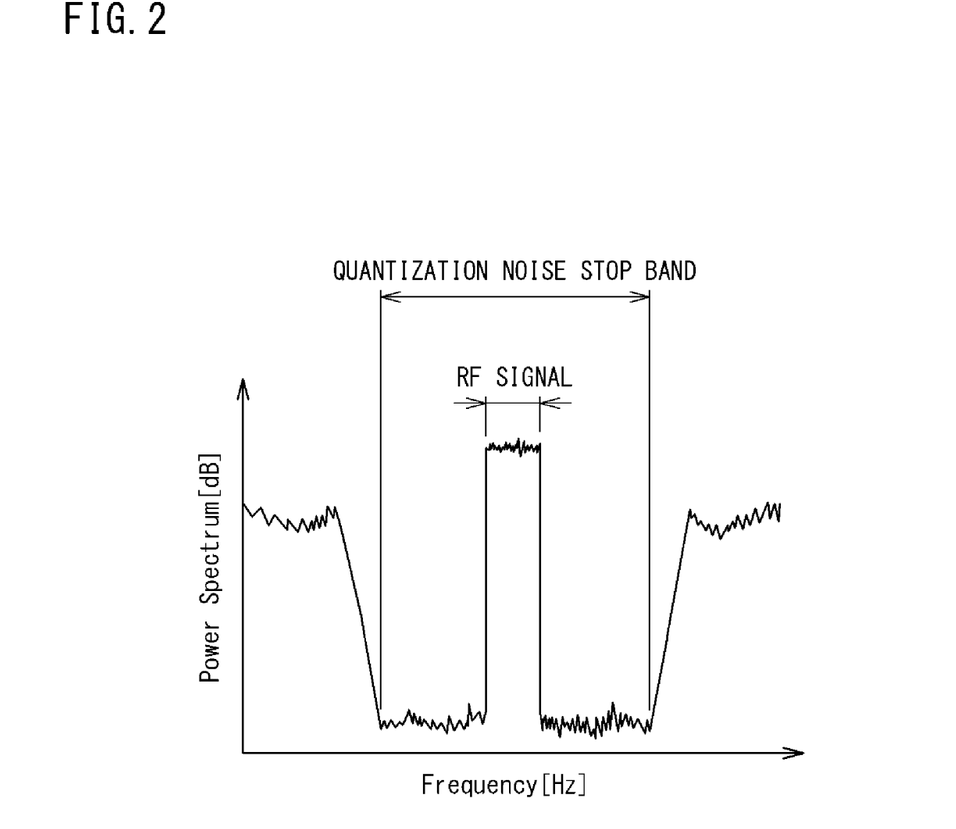
FIG. 2 shows an example of a frequency spectrum of a quantized signal outputted from a delta-sigma modulator.

FIG. 2 shows an example of a frequency spectrum of the quantized signal outputted from the delta-sigma modulator 10.

As shown in FIG. 2, the frequency spectrum of the quantized signal has a quantization noise stop band. The quantization noise stop band is a band in which quantization noise included in the quantized signal is stopped.

The quantization noise stop band is determined based on a bandpass of a loop filter (not shown) included in the delta-sigma modulator 10. The delta-sigma modulator 10 has the quantization noise stop band in a frequency band corresponding to the bandpass of the loop filter.

The bandpass of the loop filter is set to a band including the frequency band of the RF signal.

Therefore, as shown in FIG. 2, the RF signal appears in the quantization noise stop band. That is, the quantized signal includes the RF signal as a frequency component in the quantization noise stop band.

Thus, the delta-sigma modulator 10 generates the quantized signal including the RF signal.

As shown in FIG. 1, the quantized signal generated by the delta-sigma modulator 10 is given to the 1-bit digital-to-analog converter (1-bit DAC) 12.

The 1-bit digital-to-analog converter 12 has a function of converting the quantized signal that is a 1-bit digital signal into an analog pulse signal.

The analog pulse signal into which the quantized signal is converted is a binary-level pulse signal. Therefore, like the quantized signal, the analog pulse signal also includes the RF signal as a frequency component. The analog pulse signal is given to the transmission unit 3.

The 1-bit digital-to-analog converter 12 will be described in detail later.

Some of the quadrature modulator 6, the frequency converter 8, the delta-sigma modulator 10, and the 1-bit digital-to-analog converter 12 of this embodiment may be configured by a computer including a CPU, a storage unit, and the like. In this case, the computer reads out a computer program or the like stored in the storage unit and executes the computer program to realize the function units of the above components 6, 8, 10, and 12.

Alternatively, the components 6, 8, 10, and 12 of this embodiment may be configured as a semiconductor integrated circuit such as a field programmable gate array (FPGA).

The transmission unit 3 includes a power amplifier 14 and a bandpass filter (BPF) 16.

The power amplifier 14 amplifies the analog pulse signal provided from the 1-bit digital-to-analog converter 12.

The analog pulse signal amplified by the power amplifier 14 is given to the bandpass filter 16.

The bandpass filter 16 has a pass band that passes the RF signal.

When the analog pulse signal is given to the bandpass filter 16, the bandpass filter 16 outputs the RF signal. That is, the bandpass filter 16 removes frequency components (noise component, etc.) outside the band of the RF signal, from the analog pulse signal that is a binary-level pulse signal.

The RF signal outputted from the bandpass filter 16 is given to the antenna 4, and is radiated into the space as a radio wave.

[Configuration of 1-Bit Digital-to-Analog Converter]

Figure 3:
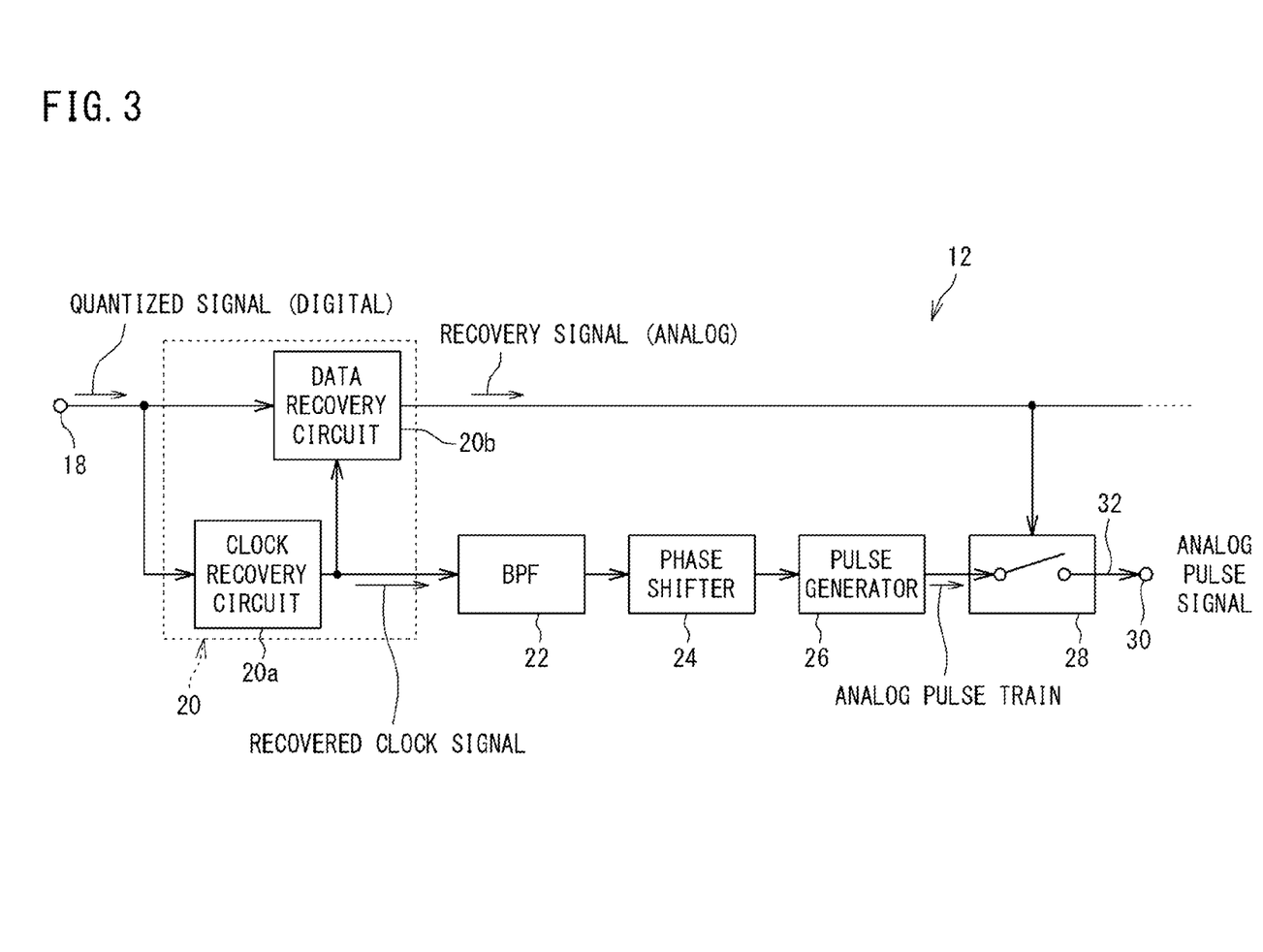
FIG. 3 is a block diagram showing a configuration of a 1-bit digital-to-analog converter according to an embodiment.

FIG. 3 is a block diagram showing the configuration of the 1-bit digital-to-analog converter 12 according to the embodiment.

The 1-bit digital-to-analog converter 12 (hereinafter also referred to as "1-bit DAC 12") includes an input terminal 18, a clock and data recovery circuit (CDR) 20, a bandpass filter (BPF) 22, a phase shifter 24, a pulse generator 26, a switch 28, and an output terminal 30.

A 1-bit digital input signal is given to the input terminal 18. In this embodiment, the digital input signal is the quantized signal from the delta-sigma modulator 10. In addition, the analog pulse signal is outputted from the output terminal 30 of the 1-bit DAC 12. As described above, the analog pulse signal is a binary-level pulse signal.

The quantized signal from the delta-sigma modulator 10 is firstly given to the CDR 20.

The CDR 20 includes a clock recovery circuit 20a and a data recovery circuit 20b.

The clock recovery circuit 20a is a circuit that extracts a clock signal from the quantized signal and recovers the clock signal, based on the quantized signal. The clock recovery circuit 20a outputs a recovered clock signal obtained by extracting and recovering the clock signal from the quantized signal.

The recovered clock signal is a binary-level rectangular wave signal.

The data recovery circuit 20b outputs a recovery signal, based on the quantized signal and the recovered clock signal. The data recovery circuit 20b includes a sample-and-hold circuit and the like, and outputs a recovery signal obtained by recovering the quantized signal. Like the quantized signal, the recovery signal includes the RF signal as a signal component.

The recovery signal is a binary-level rectangular wave signal. The recovery signal represents a 1-bit quantized signal with a Hi level voltage value and a Lo level voltage value. For example, "1" data of the quantized signal corresponds to the Hi level voltage value of the recovery signal. Likewise, "0" data of the quantized signal corresponds to the Lo level voltage value of the recovery signal.

The data recovery circuit 20b only needs to have a function of keeping the voltage level according to the data of the quantized signal, and may be configured to include an inverter circuit, a flip-flop circuit, etc., in addition to the sample-and-hold circuit.

The recovered clock signal generated by the CDR 20 is given to the BPF 22.

The BPF 22 has a function of removing, from the recovered clock signal, harmonic components included in the recovered clock signal. The recovered clock signal is a rectangular wave signal as described above, and includes harmonic components such as a third harmonic and a fifth harmonic, in addition to a fundamental component.

The recovered clock signal having passed through the BPF 22 becomes a signal from which the harmonic components have been removed and which includes the fundamental component. That is, the recovered clock signal having passed through the BPF 22 (output of the BPF 22) is a sinusoidal wave having a fundamental frequency.

The recovered clock signal having passed through the BPF 22 is given to the phase shifter 24. The phase shifter 24 has a function of adjusting the phase of the recovered clock signal. The phase adjustment by the phase shifter 24 will be described later.

The output of the phase shifter 24 is given to the pulse generator 26.

The pulse generator 26 generates an analog pulse train, based on the output of the phase shifter 24 (recovered clock signal). The pulse generator 26 includes a class C amplifier circuit.

The analog pulse train includes a plurality of pulses obtained from the recovered clock signal. The analog pulse train will be described later.

The analog pulse train generated by the pulse generator 26 is given to an output line 32. The output line 32 is a line that connects the pulse generator 26 to the output terminal 30.

The switch 28 is provided on the output line 32.

The switch 28 maintains the output line 32 in either a connected state (ON state) or a disconnected state (OFF state). The switch 28 is on/off controlled by the recovery signal.

For example, when the voltage value of the recovery signal is at the Hi level, the switch 28 maintains the output line 32 in the connected state. Meanwhile, when the voltage value of the recovery signal is a voltage lower than the Hi level, the switch 28 maintains the output line 32 in the disconnected state.

Therefore, the switch 28 outputs a signal (analog pulse signal) in which the analog pulse train is made intermittent according to the recovery signal.

The switch 28 includes, for example, a semiconductor switch or the like.

Figure 4:
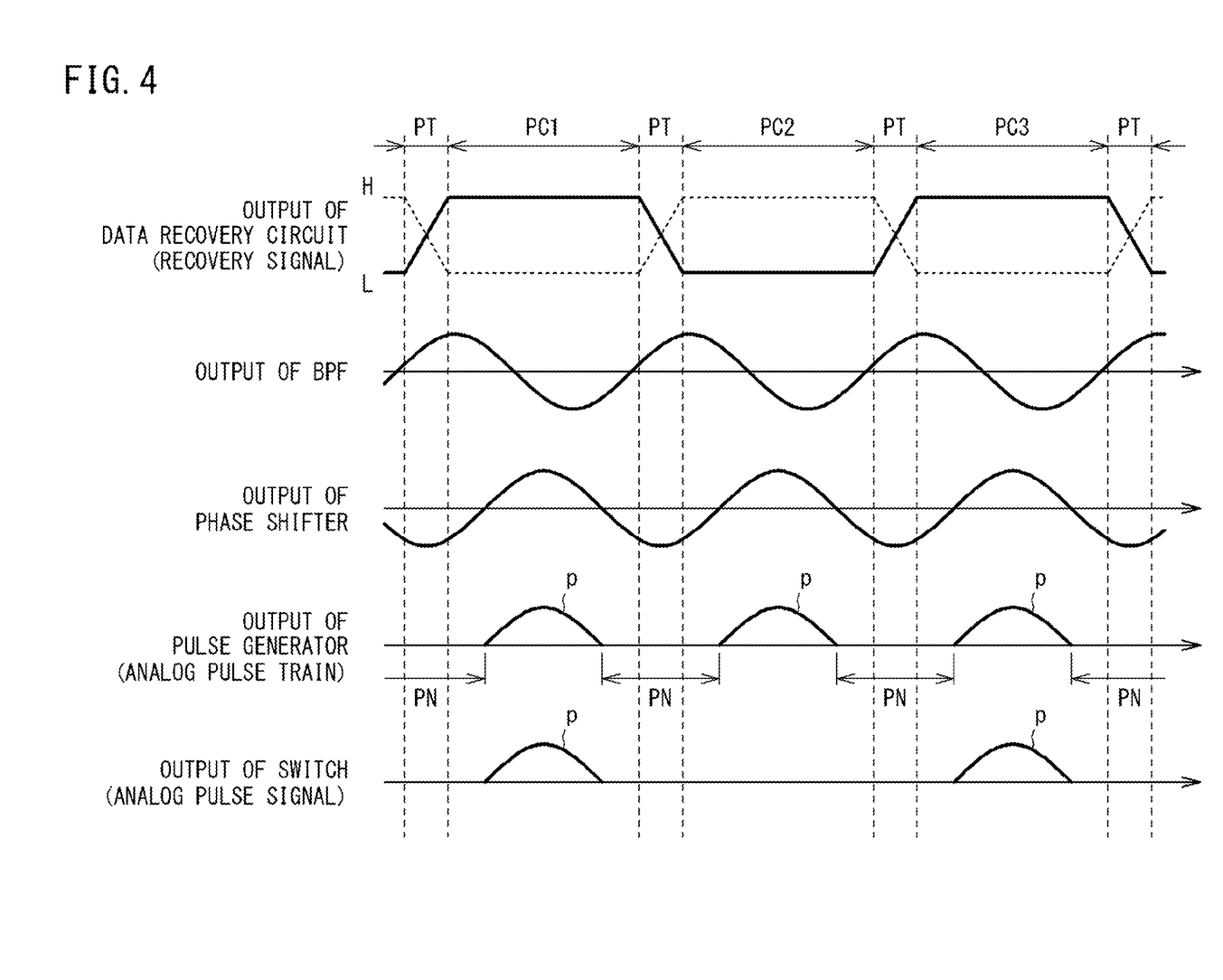
FIG. 4 shows an example of signal waveforms of outputs from components of a 1-bit DAC.

FIG. 4 shows an example of signal waveforms of outputs from the components of the 1-bit DAC 12.

In FIG. 4, the signal waveform of the recovery signal outputted from the data recovery circuit 20b is shown in the uppermost stage. Thereafter, the signal waveforms of the output of the BPF 22, the output of the phase shifter 24, the output of the pulse generator 26 (analog pulse train), and the output of the switch 28 (analog pulse signal) are shown in this order.

In FIG. 4, the horizontal axis represents time, and the horizontal axes (time) of the charts in the respective stages correspond to each other.

FIG. 4 shows changes in the signals in the respective components from when the recovered clock signal is given to the BPF 22 to when it is outputted from the switch 28.

In FIG. 4, in the recovery signal at the uppermost stage, "H" indicates a voltage value at the Hi level, and "L" indicates a voltage value at the Lo level. The recovery signal has transition periods PT and constant level periods PC.

The transition periods PT and the constant level periods PC are alternately aligned on the time axis.

Each transition period PT is a period including a rising waveform part or a falling waveform part of the waveform of the pulse signal (rectangular wave signal). The rising waveform part rises from the Lo level to the Hi level. The falling waveform part falls from the Hi level to the Lo level.

Each constant level period PC is a period in which the voltage of the pulse signal (rectangular wave signal) indicates either the Hi level or the Lo level in the waveform of the pulse signal. FIG. 4 shows constant level periods PC1, PC2, PC3. The constant level periods PC1, PC2, PC3 are collectively referred to as "constant level period PC".

In FIG. 4, each of the constant level periods PC1, PC3 is a period in which the voltage is at the Hi level. The constant level period PC2 is a period in which the voltage is at the Lo level.

As shown in FIG. 4, the output of the BPF 22 (recovered clock signal) is a sinusoidal wave. As described above, the recovered clock signal having passed through the BPF 22 (the output of the BPF 22) is a sinusoidal wave having the fundamental frequency.

The phase of the signal outputted from the BPF 22 may sometimes be delayed, due to the BPF 22, with respect to the phase of the signal that has not yet passed through the BPF 22. Therefore, a crest part of the output of the BPF 22 appears near the transition period PT of the recovery signal. The crest part of the output of the BPF 22 is shifted with respect to the constant level period PC.

As shown in FIG. 4, the output of the phase shifter 24 is also a sinusoidal wave.

A crest part of the output of the phase shifter 24 is positioned roughly in the center of the constant level period PC of the recovery signal, and roughly coincides with the constant level period PC.

Thus, the phase shifter 24 adjusts the phase of the output of the BPF 22 to make the phase of the output of the BPF 22 coincide with the phase of the recovery signal.

The output of the phase shifter 24 is given to the pulse generator 26.

As shown in FIG. 4, the output of the pulse generator 26 (analog pulse train) includes a plurality of pulses p and a plurality of non-signal periods PN which are alternately aligned along the time axis.

The plurality of pulses p are signals obtained from the output of the phase shifter 24. Each pulse p has a waveform corresponding to a part of the sinusoidal wave (output waveform of the phase shifter 24).

Each non-signal period PN is a period in which no signal is outputted.

The pulse generator 26 includes the class C amplifier circuit as described above. The class C amplifier circuit allows the pulse generator 26 to output the analog pulse train.

Figure 5:
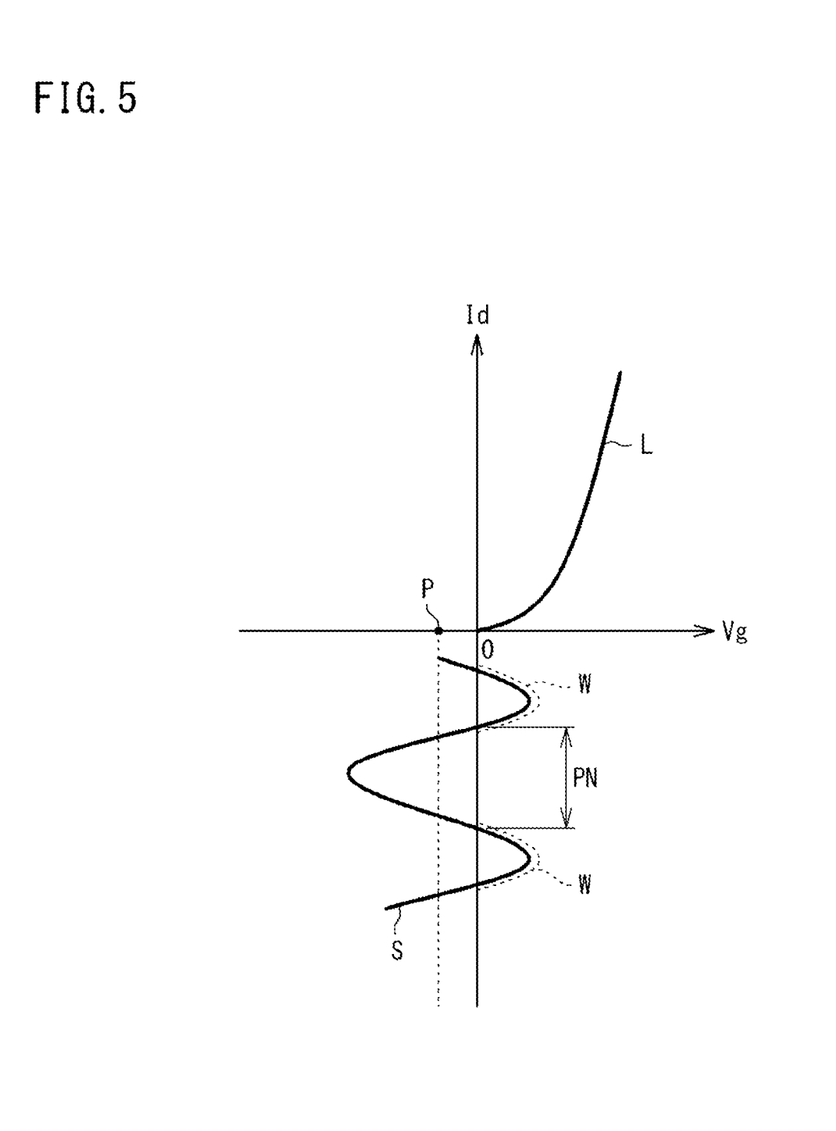
FIG. 5 shows a relationship between a gate-source voltage Vg and a drain current Id of a class C amplifier circuit included in a pulse generator.

FIG. 5 shows a relationship between a gate-source voltage Vg and a drain current Id of the class C amplifier circuit included in the pulse generator 26. In FIG. 5, the horizontal axis indicates the gate-source voltage Vg, and the vertical axis indicates the drain current Id. A line L represents characteristics of the class C amplifier circuit. The line L rises from an origin 0 in FIG. 5. Therefore, in FIG. 5, the origin 0 is an ON voltage of the class C amplifier circuit.

In FIG. 5, a line S represents the output of the phase shifter 24. An operating point P of the class C amplifier circuit included in the pulse generator 26 is set at a voltage lower than the ON voltage (origin 0).

In this case, the pulse generator 26 (class C amplifier circuit) outputs a signal obtained by amplifying the output of the phase shifter 24, only at parts, of the output of the phase shifter 24, indicated by broken lines W in FIG. 5. The signals outputted at the parts indicated by the broken lines W each have the waveform of the crest part of the sinusoidal wave outputted from the phase shifter 24.

Between a pair of parts indicated by adjacent broken lines W, the voltage of the output of the phase shifter 24 is lower than the ON voltage. Therefore, the pulse generator 26 does not output a signal during a period between the parts corresponding to the adjacent broken lines W. Therefore, a non-signal period PN is present between the parts corresponding to the adjacent broken lines W.

Specifically, the amplifier circuit of the pulse generator 26 has the operating point P that is set to amplify only a part of the output of the phase shifter 24 (recovered clock signal).

In this case, during a period for amplifying a part of the output of the phase shifter 24, the pulse generator 26 outputs a part of the output of the phase shifter 24. Meanwhile, a period other than the period for amplifying a part of the output of the phase shifter 24, becomes the non-signal period PN. Therefore, use of the class C amplifier circuit allows the pulse generator 26 to obtain the analog pulse signal in which the pulses p and the non-signal periods PN are alternately aligned (see FIG. 4).

The analog pulse train generated by the pulse generator 26 is given to the switch 28 (see FIG. 3).

As described above, the switch 28 maintains the output line 32 in the connected state when the voltage value of the recovery signal is at the Hi level. Meanwhile, the switch 28 maintains the output line 32 in the disconnected state when the voltage value of the recovery signal is a voltage lower than the Hi level.

In FIG. 4, in the transition period PT immediately preceding the constant level period PC1, the switch 28 maintains the output line 32 in the disconnected state. Therefore, in the transition period PT, the switch 28 does not output a signal.

When reaching the constant level period PC1 through the transition period PT, the voltage value of the recovery signal becomes the Hi level. Therefore, the switch 28 switches the output line 32 from the disconnected state to the connected state, and maintains the output line 32 in the connected state. During the constant level period PC1, the switch 28 outputs the output of the pulse generator 26.

Immediately after reaching the constant level period PC1, the analog pulse train is in the non-signal period PN. Therefore, the switch 28 does not output a signal or the like. Thereafter, when the non-signal period PN has ended, the switch 28 outputs a pulse p as shown in FIG. 4. When the period of the pulse p has ended, the analog pulse train again enters the non-signal period PN. Therefore, the switch 28 does not output a signal or the like.

Thereafter, when reaching the transition period PT subsequent to the constant level period PC1, the voltage value of the recovery signal becomes lower than the Hi level. Therefore, the switch 28 switches the output line 32 from the connected state to the disconnected state, and maintains the output line 32 in the disconnected state.

When reaching the constant level period PC2 through the transition period PT, the voltage value of the recovery signal is at the Lo level. Therefore, the switch 28 continues to maintain the output line 32 in the disconnected state.

During the constant level period PC2, the switch 28 does not output a signal. Therefore, no pulse p appears in the constant level period PC2.

When reaching the constant level period PC3 through the constant level period PC2 and the transition period PT, the voltage value of the recovery signal becomes the Hi level. Therefore, the switch 28 switches the output line 32 from the disconnected state to the connected state, and maintains the output line 32 in the connected state. As in the constant level period PC1, the switch 28 outputs the output of the pulse generator 26.

As described above, the switch 28 outputs the analog pulse signal in which the analog pulse train is made intermittent according to the recovery signal.

As for the analog pulse signal, a pulse p is outputted during the period in which the recovery signal is at the Hi level, while no signal is outputted during the period in which the recovery signal is at the Lo level.

Therefore, like the quantized signal and the recovery signal, the analog pulse signal includes the RF signal as a signal component.

The analog pulse signal is given to the transmission unit 3 in the subsequent stage, and the RF signal included in the analog pulse signal is radiated as a radio wave.

Here, the waveform parts, in the transition period PT, of the digital input signal and the recovery signal may sometimes be distorted such that the rising waveform part and the falling waveform part become asymmetric.

In contrast, according to the above configuration, the analog pulse signal is generated by making the analog pulse train intermittent based on the recovered clock signal (output of the phase shifter 24).

Therefore, the analog pulse signal is generated regardless of the transition periods PT of the digital input signal and the recovery signal.

Therefore, even if the aforementioned waveform distortion is present in the waveform parts, in the transition period PT, of the digital input signal and the recovery signal, the analog pulse signal does not take over the distortion of the digital input signal and the recovery signal.

As a result, it is possible to generate the analog pulse signal as a signal that is not affected by distortion of the waveform part in the transition period PT.

Moreover, in this embodiment, since the digital input signal given to the 1-bit DAC 12 is the quantized signal that is modulated by the delta-sigma modulator 10, this quantized signal can be converted into an analog signal that is not affected by distortion that occurs in the waveform part in the transition period PT.

Therefore, in the case where this analog pulse signal is given to the transmission unit 3 and the RF signal is radiated as a radio wave, the RF signal is not affected by the distortion of the waveform part in the transition period PT described above. Therefore, the quality of the RF signal is improved.

In this embodiment, the analog pulse train includes a plurality of pulses p and a plurality of non-signal periods PN having a predetermined time interval such that the pulses p and the periods PN are alternately aligned along the time axis. Therefore, it is possible to control the switch 28 such that the analog pulse train is interrupted in the non-signal periods PN. This inhibits transient components from occurring due to on/off of the switch 28, and inhibits distortion from occurring due to on/off of the switch 28.

The phase shifter 24 of this embodiment adjusts the phase of the output of the BPF 22 such that the pulses p are arranged in the constant level periods PC in the recovery signal.

Thus, the pulses p can be arranged between the transition periods PT aligned along the time axis in the recovery signal.

In this embodiment, since the BPF 22 which removes the harmonic component included in the recovered clock signal, is provided, the recovered clock signal from which the harmonic component has been removed is obtained. That is, the recovered clock signal that is a sinusoidal wave mainly including the fundamental component is obtained. Thus, the distortion component included in the recovered clock signal can be reduced.

In this embodiment, an exemplary case in which the pulse generator 26 includes the class C amplifier circuit has been described. However, the amplifier circuit included in the pulse generator 26 only needs to have an operating point P that is set to amplify only a part of the output of the phase shifter 24 (recovered clock signal), and therefore, a class B amplifier circuit or a class AB amplifier circuit may be used instead of the class C amplifier circuit.

In this embodiment, an exemplary case in which the 1-bit DAC 12 includes the phase shifter 24 has been described. However, the phase shifter 24 may be omitted as long as the pulses p can be arranged between the transition periods PT of the recovery signal.

Moreover, in this embodiment, an exemplary case in which the 1-bit DAC 12 includes the BPF 22 has been described. However, for example, the BPF 22 may be omitted if the amplifier circuit included in the pulse generator 26 outputs a signal that is limited to the band of the fundamental frequency.

In this embodiment, an exemplary case in which the phase shifter 24 is disposed between the BPF 22 and the pulse generator 26 has been described. However, the phase shifter 24 only needs to be disposed so as to follow the BPF 22, and may be disposed between the pulse generator 26 and the switch 28.

According to another aspect, the above embodiment may be a 1-bit digital-to-analog converter to which a synchronization clock signal synchronized with a 1-bit digital input signal (quantized signal) is directly given.

This 1-bit digital-to-analog converter includes a switch to which an analog pulse train based on the synchronization clock signal is given.

The switch is on/off controlled by the digital input signal, and outputs an analog pulse signal in which the analog pulse train is made intermittent according to the digital input signal.

That is, the synchronization clock signal is converted into the analog pulse train through the BPF 22, the phase shifter 24, and the pulse generator 26, and is given to the switch 28.

In this configuration, the CDR 20 (the clock recovery circuit 20a and the data recovery circuit 20b) is dispensed with.

[Evaluation of Signal Quality]

Next, a result of evaluation of signal quality of an RF signal transmitted using the transmitter 1 of the above embodiment, will be described.

Figure 6:
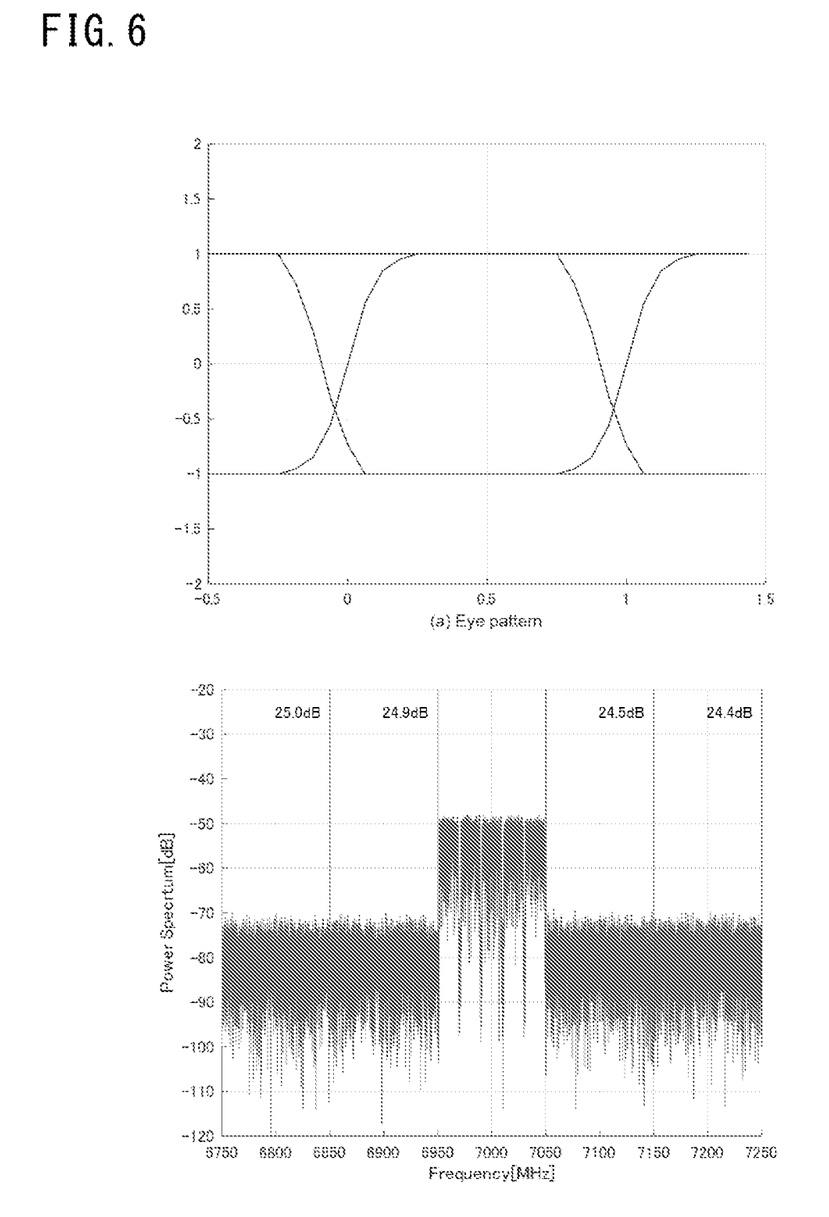
FIG. 6 shows an eye pattern and a power spectrum of a recovery signal.
Figure 7:
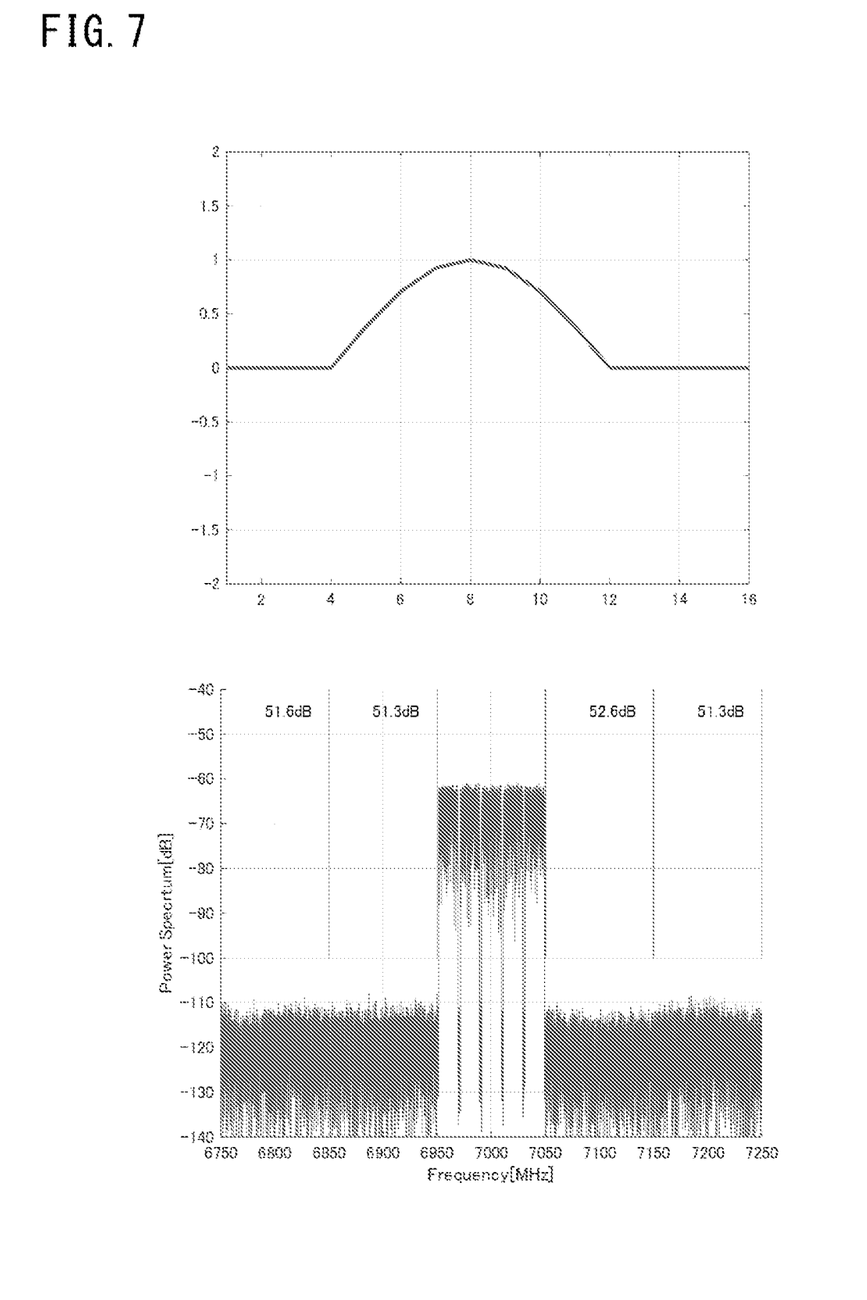
FIG. 7 shows an eye pattern and a power spectrum of an analog pulse signal.
Figure 8:
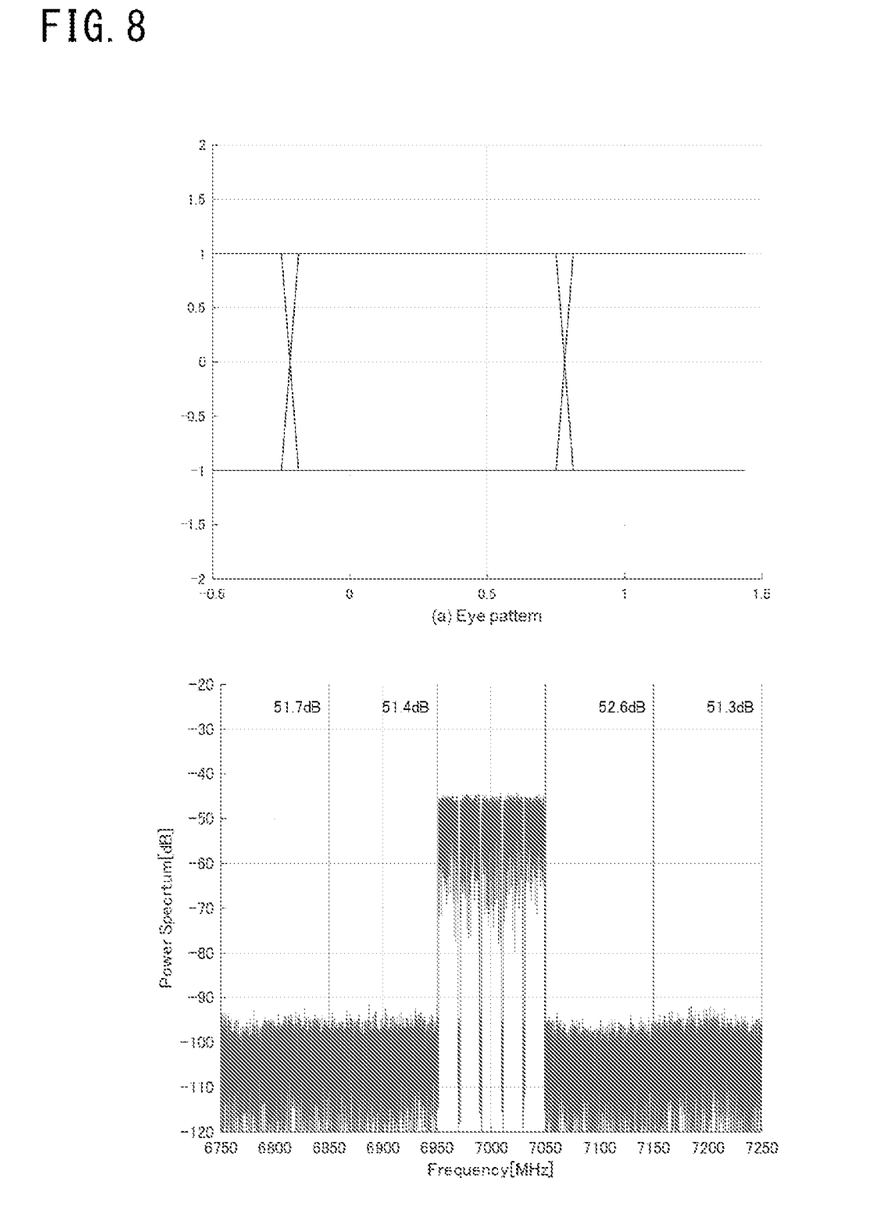
FIG. 8 shows an eye pattern and a power spectrum of an ideal waveform signal.

An evaluation method is as follows. That is, a recovery signal, an analog pulse signal, and an ideal waveform signal, in a case where an RF signal having a center frequency of 7 GHz and a bandwidth of 100 MHz was given to the delta-sigma modulator 10, were obtained through computer simulation, and adjacent channel leakage ratios (ACLR) of the obtained signals were compared with each other.

Here, the recovery signal is a signal outputted from the data recovery circuit 20b. In the conventional art, this recovery signal was given to the subsequent transmission unit 3 in some cases.

The analog pulse signal is a signal outputted from the switch 28.

The ideal waveform signal is a signal obtained when the waveform of the analog pulse signal outputted from the 1-bit DAC 12 is made an ideal rectangular waveform.

FIG. 6 shows an eye pattern and a power spectrum of the recovery signal.

FIG. 7 shows an eye pattern and a power spectrum of the analog pulse signal.

FIG. 8 shows an eye pattern and a power spectrum of the ideal waveform signal.

In each of FIG. 6, FIG. 7, and FIG. 8, the eye pattern is shown in the upper stage, and the power spectrum is shown in the lower stage. The power spectrum in each of FIG. 6, FIG. 7, and FIG. 8 is shown such that a region near the frequency band of the RF signal is enlarged.

As shown in FIG. 6, in the eye pattern of the recovery signal, a zero-cross point is offset downward, and a rising waveform part and a falling waveform part are asymmetric.

In addition, it is found from the power spectrum of the recovery signal that the ACLR of the RF signal is about 25 dB.

As shown in FIG. 7, in the eye pattern of the analog pulse signal, only a waveform representing a pulse p (FIG. 4) appears. Since the analog pulse signal is a signal obtained by making the analog pulse train including the pulses p and the non-signal periods PN (FIG. 4) intermittent, only the waveform representing the pulse p appears.

In addition, it is found from the power spectrum of the analog pulse signal that the ACLR of the RF signal is about 52 dB.

Furthermore, according to FIG. 8, the ACLR of the RF signal in the ideal waveform signal is also about 52 dB.

As described above, the ACLR of the RF signal in the analog pulse signal is almost equal to the ACLR of the RF signal in the ideal waveform signal, and it is found that the 1-bit DAC 12 of this embodiment improves the signal quality of the RF signal.

In comparing the eye patterns, the analog pulse signal does not include a part corresponding to the waveform part in the transition period PT of the recovery signal, which makes it clear that the analog pulse signal is generated regardless of the transition period PT. Therefore, the analog pulse signal becomes a signal that is not affected by distortion of the waveform part in the transition period PT.

Moreover, since the ACLR of the RF signal in the analog pulse signal is almost the same value as the ACLR in the ideal waveform signal, it is found that the RF signal is not affected by distortion of the waveform part in the transition period PT.

[Others]

Note that the embodiment disclosed herein is merely illustrative in all aspects and should not be recognized as being restrictive.

In the above embodiment, an exemplary case in which the 1-bit digital input signal given to the 1-bit DAC 12 is the quantized signal from the delta-sigma modulator 10, has been described. However, the 1-bit DAC 12 is able to process, as an input signal, any signal from devices other than the delta-sigma modulator as long as the input signal is a 1-bit digital input signal.

The scope of the present invention is defined by the scope of the claims rather than the meaning described above, and is intended to include meaning equivalent to the scope of the claims and all modifications within the scope.

REFERENCE SIGNS LIST 1 transmitter
2 digital signal processing unit (signal processing device)
3 transmission unit
4 antenna
5 quadrature modulator
8 frequency converter 10 delta-sigma modulator
12 1-bit digital-to-analog converter
14 power amplifier
16 bandpass filter
18 input terminal
20 clock and data recovery circuit (CDR)
20a clock recovery circuit
20b data recovery circuit
22 BPF
24 phase shifter
26 pulse generator
28 switch
30 output terminal
32 output line

The invention claimed is:

1. A 1-bit digital-to-analog converter comprising:
a clock and data recovery circuit configured to output a recovered clock signal and a recovery signal, based on a 1-bit digital input signal; and
a switch to which an analog pulse train based on the recovered clock signal is given, wherein
the switch is on/off controlled by the recovery signal, and outputs an analog pulse signal in which the analog pulse train is made intermittent according to the recovery signal.

2. The 1-bit digital-to-analog converter according to claim 1, wherein
the analog pulse train includes a plurality of pulses obtained from the recovered clock signal and a plurality of non-signal periods having a predetermined time interval such that the pulses and the non-signal periods are alternately aligned along a time axis.

3. The 1-bit digital-to-analog converter according to claim 2, further comprising a pulse generator configured to generate the analog pulse train, based on the recovered clock signal.

4. The 1-bit digital-to-analog converter according to claim 3, wherein
the pulse generator includes an amplifier circuit having an operating point that is set to amplify only a part of the recovered clock signal.

5. The 1-bit digital-to-analog converter according to claim 2, further comprising a phase shifter configured to adjust a phase of the recovered clock signal or a phase of the analog pulse train such that the pulses are arranged in constant level periods in the recovery signal.

6. The 1-bit digital-to-analog converter according to claim 1, further comprising a bandpass filter configured to remove a harmonic component included in the recovered clock signal, from the recovered clock signal.

7. The 1-bit digital-to-analog converter according to claim 1, wherein
the 1-bit digital input signal is a quantized signal modulated by a delta-sigma modulator.

8. A signal processing device comprising:
a delta-sigma modulator; and
the 1-bit digital-to-analog converter according to claim 1 to which a quantized signal outputted from the delta-sigma modulator is given as a 1-bit digital input signal.

9. A transmitter comprising:
a delta-sigma modulator configured to perform delta-sigma modulation on an RF signal;
the 1-bit digital-to-analog converter according to claim 1 to which a quantized signal outputted from the delta-sigma modulator is given as a 1-bit digital input signal; and
a transmission unit configured to wirelessly transmit the analog pulse signal.

10. A conversion method for converting a 1-bit digital input signal, comprising:
generating a recovered clock signal and a recovery signal, based on the digital input signal;
generating an analog pulse train, based on the recovered clock signal; and
generating an analog pulse signal in which the analog pulse train is made intermittent according to the recovery signal.

* * * * *